(12) United States Patent
Galbi et al.

(10) Patent No.: US 6,348,825 B1
(45) Date of Patent: Feb. 19, 2002

(54) HIGH PERFORMANCE, LOW POWER, SCANNABLE FLIP-FLOP

(75) Inventors: Dwight Elmer Galbi; Luis Antonio Basto, both of Austin, TX (US)

(73) Assignee: Analog Devices, Inc., Worwood, MA (US)

( * ) Notice: Subject to any disclaimer, the term of this patent is extended or adjusted under 35 U.S.C. 154(b) by 0 days.

(21) Appl. No.: 09/565,424

(22) Filed: May 5, 2000

(51) Int. Cl.[7] ............................................. H03K 3/356
(52) U.S. Cl. ........................ 327/218; 327/202; 327/203
(58) Field of Search ................................. 327/202, 203, 327/210, 211, 212, 208, 218

(56) References Cited

U.S. PATENT DOCUMENTS

| | | | | |
|---|---|---|---|---|
| 4,495,628 A | * | 1/1985 | Zasio | 377/70 |
| 5,003,204 A | * | 3/1991 | Cushing et al. | 326/40 |
| 5,619,157 A | * | 4/1997 | Kumata et al. | 327/203 |
| 5,689,517 A | * | 11/1997 | Ruparel | 714/731 |

* cited by examiner

*Primary Examiner*—Tuan T. Lam
(74) *Attorney, Agent, or Firm*—Jeffrey Van Myers

(57) ABSTRACT

A dual-edge pulse-triggered flip-flop comprising a gated data latch and a gated scan latch coupled in series with the data latch. In normal operation, the data latch captures a data input D in response to clock pulses ckp generated on each edge of a system clock ck. During an input scan operation, a selected stimulation bit presented on a scan input SI is transferred first into the scan latch in response to a scan input clock ak, and then into the data latch in response to a scan output clock bk. This stimulation bit is simultaneously presented on a scan output SO. During an output scan operation, a data bit Q presented on the scan input SI is transferred first into the scan latch in response to the scan input clock ak, and then into the data latch in response to the scan output clock bk. This data bit is simultaneously presented on the scan output SO. A scan chain can be formed by coupling the scan input SI of a first flip-flop to the scan output SO of a second, upstream flip-flop, and the scan output SO of the first flip-flop to the scan input SI of a third, downstream flip-flop.

10 Claims, 2 Drawing Sheets

HIGH PERFORMANCE, LOW POWER, SCANNABLE FLIP-FLOP

BACKGROUND OF THE INVENTION

1. Technical Field

The present invention relates generally to flip-flop circuits, and, in particular, to a scannable, dual-edge pulse-triggered flip-flop.

2. Background Art

In general, in the descriptions that follow, we will italicize the first occurrence of each special term of art which should be familiar to those skilled in the art of designing integrated circuits. In addition, when we first introduce a term that we believe to be new or that we will use in a context that we believe to be new, we will bold the term and provide the definition that we intend to apply to that term. In addition, throughout this description, we may use the terms assert and negate when referring to the rendering of a signal, signal flag, status bit, or similar apparatus into its logically true or logically false state, respectively. For convenience, we will indicate an active low signal by appending an asterisk ("*") to the signal name.

Scan testing is a common and widely used technology to achieve verifiable high fault coverage in digital designs. The two most commonly used scan techniques are muxed scan and Level Sensitive Scan Design or LSSD. Scan cells are usually implemented with minimum size transistors to have the least impact on area and speed. Since scan is a test mode, it is generally relegated to running at low speeds because its primary use is in detecting stuck-at faults.

Design geometries continually shrink to achieve higher performance and density. Scan design typically follows functional design and many configurations are available for the design of flip-flops. In a typical single edge-triggered flip-flop design, data is captured on only a single edge of the clock. In a dual edge-triggered design, two single edge-triggered flip-flops are coupled in parallel so that each captures data on respective edges of the clock. Thus, the clock frequency can be reduced in half with the same data rate, thereby saving very significant power in the clock tree network. Since in high performance designs, as much as half of the power of the chip can be consumed by the clock network, using dual edge-triggered designs can reduce overall chip power by up to a quarter. Dual edge-triggered flip-flops are, however, difficult to make low power. Furthermore, using both edges of the clock is inherently a testability problem since one of the primary rules for scan design is to capture data on only one edge of the clock.

As clock periods decrease in high performance designs, the clock cycle time becomes a critical design factor. Latch-based designs allow for time borrowing between stages of logic. This often can balance the delay between two stages of logic to allow a higher performance target to be achieved. However, in typical flip-flop based designs, no time borrowing between stages of logic is possible. Pulse-triggered flip-flops can be used to solve this problem, because they allow for some time borrowing to achieve maximum performance, yet remain a flip-flop based design. Since pulse-triggered flip-flops need only a single data latch instead of the pair of back-to-back data latches used in typical flip-flop designs, the propagation delay of the flip-flop is also significantly reduced. One technique to generate the clock pulses from a single clock is to use a two-input AND gate with one input coupled directly to the clock and another input coupled to the clock via an inverter chain. Data is clocked into the flip-flop for the short duration of each pulse. The number of inverter stages determines the pulse width, which in turn determines how much time borrowing is allowed. A trade-off must be made between making the pulse wider, which allows for more time borrowing, or narrower, which reduces the hold time requirement of the flip-flop.

If the circuit speed is adequate, a pulse-triggered circuit can be triggered on both edges of the clock. To generate the required double-rate clock pulses, an Exclusive Or gate may be substituted for the AND gate. However, there is no known dual-edge pulse-triggered flip-flop that is scannable.

What is needed, therefore, is a high performance, low power, scannable flip-flop.

BRIEF SUMMARY OF THE INVENTION

In accordance with our invention, we have provided a dual-edge pulse-triggered flip-flop that is a combination of design techniques for high performance, low power, and scan testability.

BRIEF DESCRIPTION OF THE SEVERAL VIEWS OF THE DRAWINGS

Our invention may be more fully understood by a description of certain preferred embodiments in conjunction with the attached drawings in which.

Figure 1:
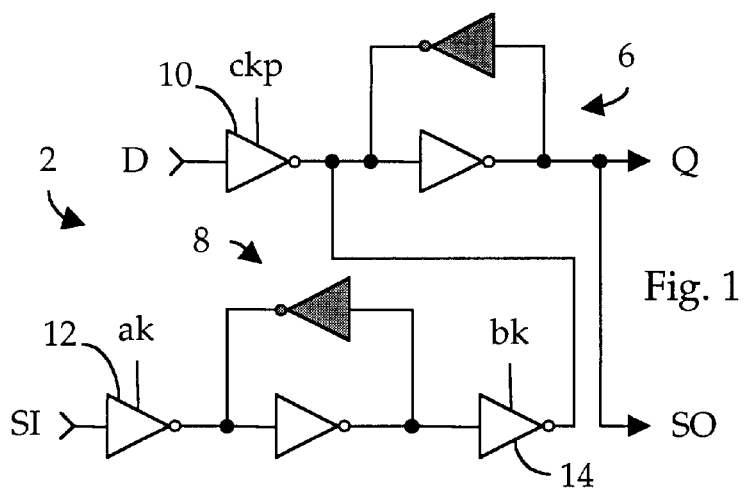
FIG. 1 is a schematic diagram of a high performance, low power, scannable flip-flop according to an embodiment of our invention.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Figure 2:
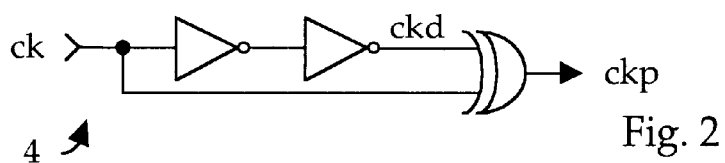
FIG. 2 is a schematic diagram of a dual-edge clock pulse generator for use with the flip-flop of FIG. 1.
Figure 3:
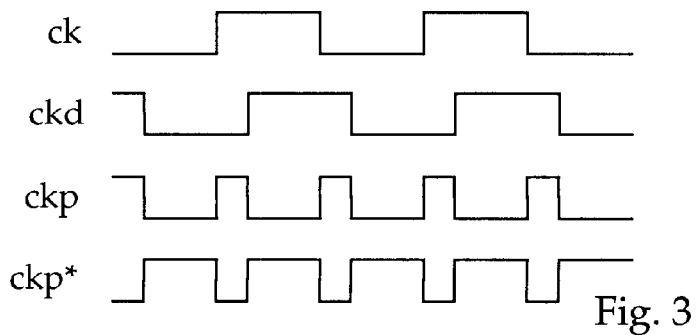
FIG. 3 is a timing diagram of the operation of the clock pulse generator of FIG. 4.

Shown in FIG. 1 is a high performance, low power, scannable flip-flop 2 according to the preferred embodiment of our invention. Shown in FIG. 2 is a clock pulse generator 4 suitable for use with our flip-flop 2. The series of clock pulses ckp produced by the generator 4 in response to the edges of a system clock ck is illustrated in FIG. 3.

In general, the flip-flop 2 is comprised of a gated data latch 6 and a gated scan latch 8, with appropriate support logic. During normal operation, a data input gate 10 is opened by the leading edge of a clock pulse ckp, allowing the data latch 6 to track a data input D; the trailing edge of ckp closes the data input gate 10, thus capturing the then-current logic value of D and stabilizing the data output Q for use by the downstream logic. Since the generator 4 produces a clock pulse in response to both the leading and trailing edges of the system clock, and the data latch 6 captures D in response to each clock pulse, the flip-flop 2 functions as a dual-edge pulse-triggered flip-flop.

In scan shift mode, the system clock ck is held either high or low to prevent any pulses from being generated, thus preserving the then-current state of the data latch 6. During an input scan operation, a scan input gate 12 is clocked by a scan input clock ak, allowing the scan latch 8 to capture a bit s of a particular stimulation bit pattern, presented serially at a scan input or SI; a scan output gate 14 is then clocked by a scan output clock bk, allowing the data latch 6 to capture s and to present s at a scan output or SO to the next link in a scan chain. This sequence is continued until the full stimulation pattern is properly aligned, at which time, the system clock ck will be toggled to inject the stimulation bits into the target logic via the Q outputs of each respective data latch 6. For an output scan operation, the scan clocks ak and bk are toggled to shift the state Q of each respective data latch 6 into the next sequential scan latch 8 in the scan chain until the result bit pattern is presented serially at a scan output or SO.

For convenience, we have indicated by shading that the feedback inverters in both the data latch 6 and the scan latch 8 are small, resistive keepers. As usual, the tradeoff between the drive capabilities and the operating speed of the primary inverters of each of the latches can be adjusted as required in specific circuit instants. We prefer to use clocked inverters for each of the input and output gates.

Figure 4:
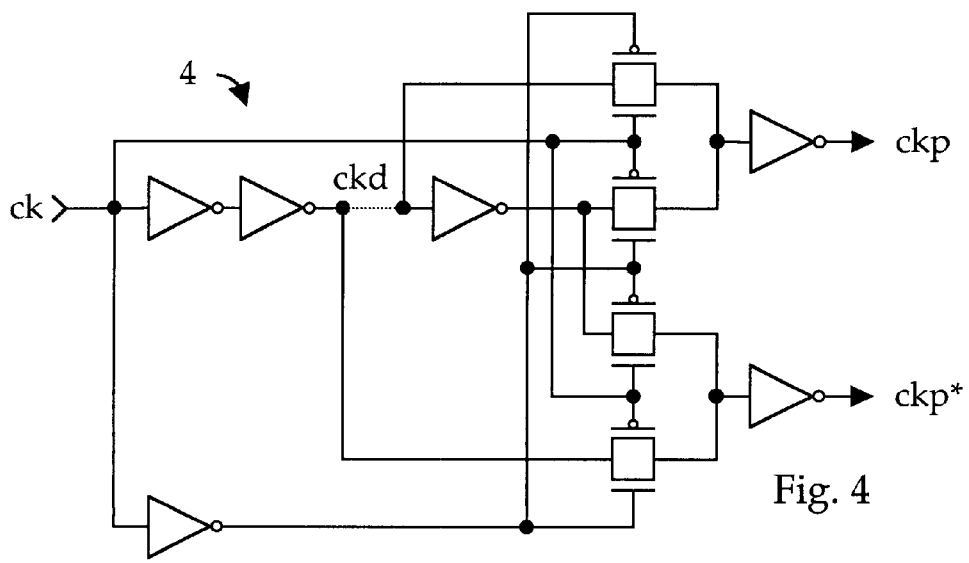
FIG. 4 is a detailed circuit diagram of the generator of FIG. 2 according to the preferred embodiment of our invention.
Figure 5:
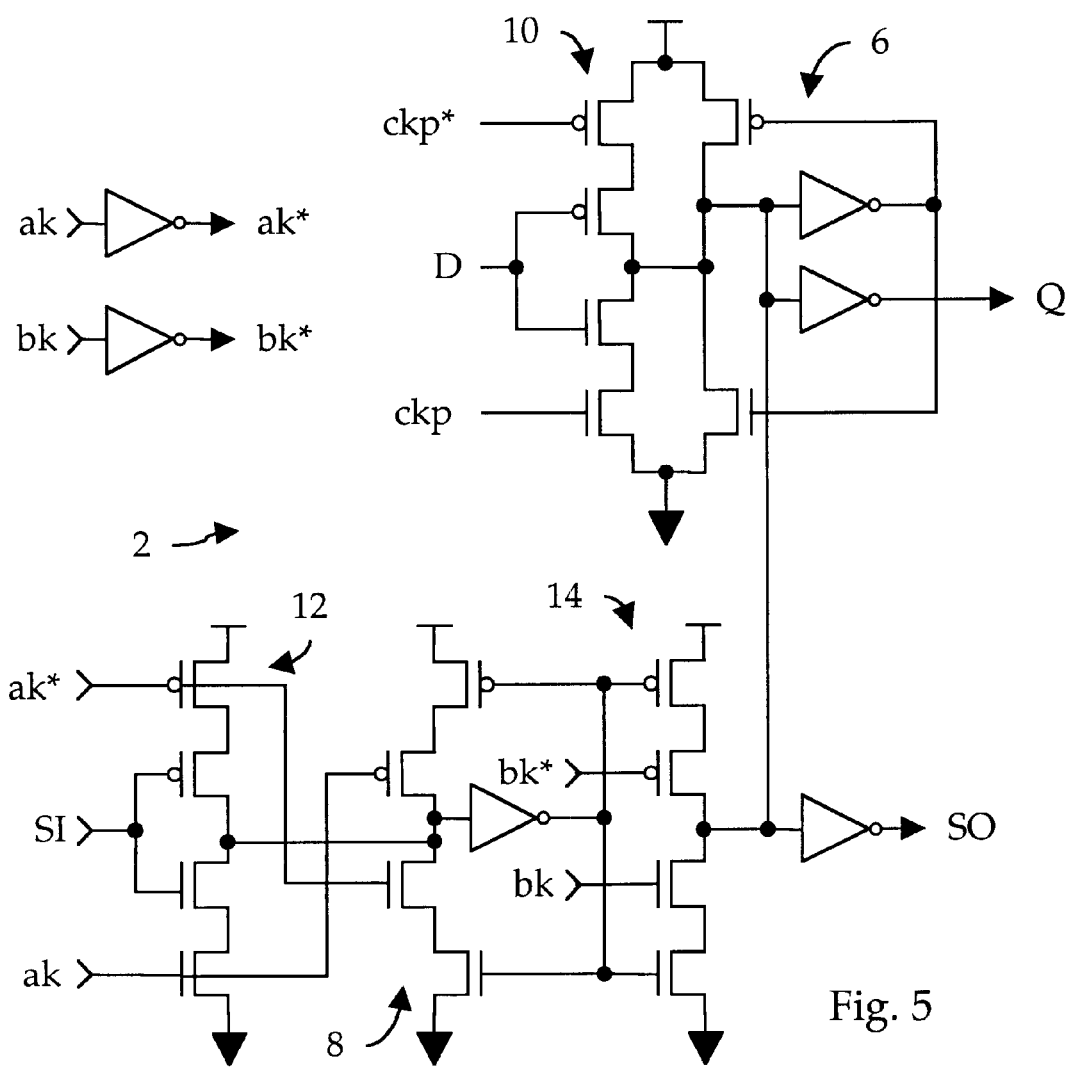
FIG. 5 is a detailed circuit diagram of the flip-flop of FIG. 1 according to the preferred embodiment of our invention.

Shown in FIG. 4 is our preferred CMOS circuit embodiment of the generator 4 of FIG. 2. To enable high speed operation at low power, the generator 4 circuit uses pass gates to produce fully symmetric clock pulses ckp and ckp*, as shown in FIG. 3. Shown in FIG. 5 is our preferred CMOS circuit embodiment of our flip-flop 2 of FIG. 1. Because this circuit is fully symmetric, we generate the active low forms of the scan clocks ak and bk, namely ak* and bk*, using conventional inverters. In addition, to reduce the loading on the latches, we have added output buffers to both the Q and SO outputs.

Thus it is apparent that we have provided a fully scannable, pulse-triggered flip-flop. In the preferred dual-edge, pulse-triggered form, our flip-flop is both high-performance and low power. Although we have disclosed our preferred implementation for the flip-flop 2, those skilled in the art will recognize that modifications and variations can be made without departing from the spirit of our invention. For example, the latches may be constructed so as to be selectively enabled or set/reset. If desired, the feedback inverters, rather than being resistive keepers, may be clocked. Further, the several gates may be either pass-gate or tri-state. Therefore, we intend that our invention encompass all such variations and modifications as fall within the scope of the appended claims.

What we claim is:

1. A scannable pulse-triggered flip-flop comprising:
   a data latch having an input and an output, the data latch consisting of a pair of cross-coupled inverters;
   a data input gate which couples a data input to the input of the data latch in response to a clock pulse;
   a scan latch having an input and an output;
   a scan input gate which couples a scan input to the input of the scan latch in response to a scan input clock; and
   a scan output gate which couples the output of the scan latch to the input of the data latch in response to a scan output clock.

2. The flip-flop of claim 1 wherein the clock pulse is generated in response to each edge of a clock signal.

3. The flip-flop of claim 2 wherein the clock pulse is generated only during a normal mode of operation.

4. The flip-flop of claim 3 wherein the scan input and scan output clocks are generated only during a scan mode of operation.

5. The flip-flop of claim 1 wherein said scan latch is comprised of:
   a primary inverter having an input and an output; and
   a feedback inverter having an input coupled to the output of the primary inverter, and an output coupled to the input of the primary inverter.

6. The flip-flop of claim 5 wherein each gate is comprised of a clocked inverter.

7. A scannable pulse-triggered flip-flop comprising:
   a data latch consisting of:
      a first primary inverter having an input and an output; and
      a first feedback inverter having an input coupled to the output of the first primary inverter, and an output coupled to the input of the first primary inverter;
   a data input gate comprising a first clocked inverter which couples a data input to the input of the first primary inverter in response to a clock pulse;
   a scan latch comprising:
      a second primary inverter having an input and an output; and
      a second feedback inverter having an input coupled to the output of the second primary inverter, and an output coupled to the input of the second primary inverter;
   a scan input gate comprised of a second clocked inverter which couples a scan input to the input of the second primary inverter in response to a scan input clock; and
   a scan output gate comprised of a third clocked inverter which couples the output of the second primary inverter to the input of the first primary inverter in response to a scan output clock.

8. The flip-flop of claim 7 wherein the clock pulse is generated in response to each edge of a clock signal.

9. The flip-flop of claim 8 wherein the clock pulse is generated only during a normal mode of operation.

10. The flip-flop of claim 9 wherein the scan input and scan output clocks are generated only during a scan mode of operation.